United States Patent [19]

Shepherd et al.

[11] Patent Number: 4,459,739
[45] Date of Patent: Jul. 17, 1984

[54] THIN FILM TRANSISTORS

[75] Inventors: Frank R. Shepherd, Kanata; William D. Westwood, Nepean, both of Canada

[73] Assignee: Northern Telecom Limited, Montreal, Canada

[21] Appl. No.: 449,432

[22] Filed: Dec. 13, 1982

Related U.S. Application Data

[60] Division of Ser. No. 266,630, May 26, 1981, Pat. No. 4,422,090, which is a continuation-in-part of Ser. No. 60,275, Jul. 25, 1979, abandoned.

[51] Int. Cl.³ .............. H01L 49/02; H01L 21/38; H01L 21/425; H01L 29/22
[52] U.S. Cl. .................................. 29/571; 148/1.5; 357/23; 357/4
[58] Field of Search ............... 29/571; 357/4, 12 TP; 148/1.5

[56] References Cited

U.S. PATENT DOCUMENTS

| | | | |
|---|---|---|---|
| 3,289,054 | 11/1966 | Haering et al. | 357/4 |
| 3,405,331 | 10/1968 | Skalski et al. | 357/4 |
| 3,419,766 | 12/1968 | Ono | 29/571 |
| 4,332,075 | 6/1982 | Ota et al. | 29/571 |

Primary Examiner—Aaron Weisstuch
Assistant Examiner—Hunter L. Auyang
Attorney, Agent, or Firm—Stuart L. Wilkinson

[57] ABSTRACT

A thin film transistor has a semiconductor layer, an insulating layer and source, drain and gate electrodes. The improvement comprises creating an enhanced conductivity layer in the semiconductor by ion implantation or diffusion on phased deposition. The benefits of the enhanced conductivity layer are that transistor action is obtained without the conventional annealing step and DC stability is much improved.

12 Claims, 6 Drawing Figures

THIN FILM TRANSISTORS

This application is a divisional application of application Ser. No. 266,630 filed May 26, 1981, now U.S. Pat. No. 4,422,090 which is a continuation-in-part of application Ser. No. 060,275, filed July 25, 1979, now abandoned.

This invention relates to thin film transistors (TFTs) and to method for their fabrication.

Thin film transistors (TFTs) are somewhat analagous to metal-oxide-semiconductor field effect transistors (MOSFETS) but whereas high quality single crystal semiconductor substrates are used in MOSFETS, all the components in TFTs are deposited onto an insulating substrate such as glass, and polycrystalline semiconductor layers are often employed. In a simple three terminal TFT, the source and drain electrodes are in contact with one surface of a semiconductor layer and separated by a small gap; the other surface of the semiconductor layer lies at the interface with an insulating dielectric layer upon whose outer surface is a conducting gate electrode. That part of the semiconductor layer between the source and drain electrodes which projects onto the gate contains a channel, the conductivity of which may be modulated by the applied gate voltage so as to control the source drain current.

During TFT fabrication, the various thin film layers are either deposited through metal masks, or blanket layers are deposited and the desired patterns are produced by photoengraving. Where large area high resolution patterns and precision alignment are involved, the former approach, although involving expensive and complex equipment inside the vacuum system, does maintain relatively clean interfaces since all films are deposited in one vacuum cycle. The latter technique requires no special equipment inside the vacuum system, but atmospheric contamination of interfaces due to photoengraving is potentially harmful to the devices. In a typical transistor structure, a gate electrode, for example chromium (Cr), is first defined on an insulating substrate, for example, glass (e.g. Corning (RTM) 7059). A dielectric layer, for example, aluminum oxide ($Al_2O_3$), is deposited to cover and extend laterally beyond the gate. A semiconductor layer, for example, cadmium selenide (CdSe), is deposited over the dielectric layer and finally source and drain electrodes, for example chromium (Cr), are defined over the gate, the source-drain gap length being of the order of 30 $\mu m$.

Appropriate leads may now be connected to this structure but it will not function well as a transistor unless it is subjected to an annealing cycle. Typically these devices are annealed at about 350° C. for about 1 hour in an inert atmosphere, for example, nitrogen. Although the importance of annealing to achieving good transistor operation has been recognized, the physical significance of this step has not been explained satisfactorily.

Research leading to the present invention suggests that during annealing source-drain metallization diffuses into the semiconductor and dopes the semiconductor to lower its resistivity. Simultaneously, residual oxygen in the annealing atmosphere also diffuses into the semiconductor to restore the resistivity of most of the semiconductor layer. The source-drain metal diffusion leaves a narrow doped region in the semiconductor between the source and drain electrodes and near the semiconductor dielectric interface which is oxygen free. In the remainder of the semiconductor between the source-drain gap, diffused metallization and oxygen seem to be chemically associated and this compensated region acts as a high resistance in parallel with the conducting channel. The precise distribution of components in the annealed transistor, and its operating characteristics depend on the specific annealing conditions.

Thin film transistors fabricated in this way often exhibit poor DC stability. In particular the source-drain current may decrease in response to particular source-drain and gate voltages. This appears to derive from carriers (electrons) flowing in the conducting channel near the dielectric interface being captured by traps in the oxide.

The problem of carrier drift may be solved by a thin film transistor which, according to one aspect of the invention comprises a gate, a dielectric layer, a semiconductor layer having upper and lower boundaries, and spaced source and drain electrodes, the improvement comprising an enhanced conductivity zone introduced into the semiconductor layer at a location spaced from the boundaries thereof.

According to another aspect, a method of fabricating a thin film transistor comprises depositing upon a substrate:

a semiconductor layer having a zone of enhanced conductivity spaced from respective boundaries of the layer;

an insulating layer to have surface contact with said semiconductor layer;

first and second conducting regions to contact said semiconductor layer at spaced locations; and a third conducting region at one side of the insulation layer remote from the semiconductor layer to be coextensive with a part at least of the space between said first and second conducting regions.

Embodiments of the invention will now be described by way of exaple, with reference to the accompanying drawings, in which.

Figure 1:
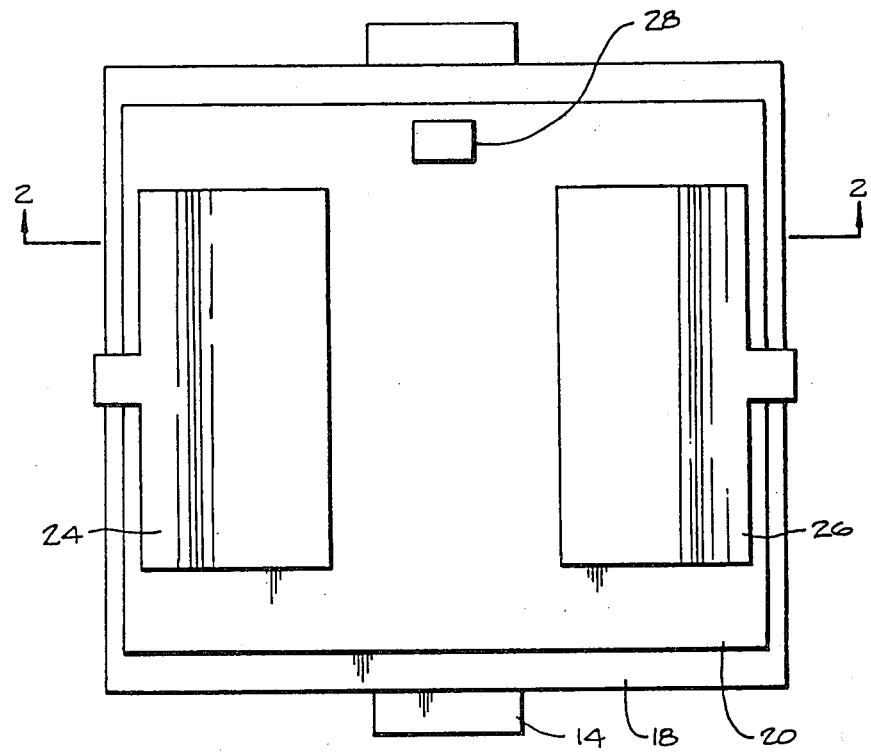
FIG. 1 shows a sectional view of a TFT according to the invention.

As previously mentioned, TFTs can be fabricated by depositing the films through appropriately patterned masks or by depositing blanket layers and defining the patterns by photoengraving. In an embodiment using the latter technique to fabricate TFTs of the type shown in FIG. 1, a Corning (RTM) 7059 glass substrate 10 is first cleaned, for example, by the following procedure: the substrate is ultrasonically cleaned in a detergent solution, rinsed in dionized water, lightly etched in dilute hydrofluoric acid, thoroughly rinsed in deionized water, then vapor dried in isopropyl alcohol. A film of chromium about 500 Å thick is vacuum deposited onto the substrate, and a pattern of gate electrodes 14, of which one is shown, is defined by conventional photoengraving, for example, using ferric ammonium nitrate as an etchant. Next, a film 18 of aluminum oxide ($Al_2O_3$) about 1000–2000 Å thick, a film 20 of cadmium selenide (CdSe) about 800–1000 Å thick and a film of aluminum about 500 Å thick are deposited sequentially without breaking vacuum. A set of source and drain electrodes 24 and 26 is then defined in the aluminum vertically above each gate by conventional photoengraving procedures, for example, using phosphoric acid as an etchant. The source-drain gap is of the order of 5 to 50 $\mu m$.

A window 28 is then etched through the films to allow contact to be made to the gate electrode, the remainder of the structure being protected by a layer of etch resist during this step. After removing the resist in a conventional manner, the whole substrate is then ion implanted.

EXAMPLES

Sample substrates were successively implanted with 50 KeV $^{52}$Cr, 50 KeV $^{27}$Al and 15 KeV $^{11}$B up to doses of $1 \times 10^{16}$ cm$^{-12}$, equivalent to a few monolayers of metal. The mean ranges of these ions were about 275 Å for Cr, 495 Å for Al and 370 Å for B and their distribution widths in the CdSe were broad, of the same order as their ranges.

For Cr and Al ion implantation, a mass filtered beam with a current of 3 to 8 $\mu$m and cross section of about 3 cm $\times$ 1 mm was magnetically swept across an aperture to implant an area up to 3 cm $\times$ 1.5 cm using an isotope separator. Doses were determined by monitoring beam current and by Rutherford backscattering. B ion implantation was performed in an Extrion model no. 1000-200 ion implanter at a current of 200 $\mu$A. A 2$\times$2 cm beam was swept across the sample by mechanical motion of a rotating carousel. The implanted ions create a localized conducting layer 30 within the semiconductor film spaced both from its top surface and the semiconductor-dielectric interface. The implanted ions may extend throughout the semiconductor layer thickness so long as their concentration profile is such as to maintain current within an internal layer spaced from both surfaces of the semiconductor layer. The concentration of donors from the implanted ions at the film surfaces should be relatively low to avoid strong surface scattering.

If appropriate voltages are applied to the sample devices, for example by a transistor curve tracer, sorce-drain current flows and is modulated by the applied gate voltage.

Cr, Al and B ion implantation all yield working devices for a certain range of doses. Since the film temperature remains below 20° C., it can be concluded that there is no diffusion of the type occurring during a thermal annealing cycle. Devices obtained show a substantial improvement in DC stability compared with devices processed in the conventional manner which are thermally annealed. This appears to stem from the conducting channel 30 produced by ion implantation being located some distance from the semiconductor dielectric interface, thus reducing the effect of traps in the dielectric.

The threshold doses for modulation in order that the device operates as a transistor is similar for Cr and B ions which have similar ranges but is lower for Al ions which have a larger range. The threshold behaviour can be explained by the existence of grain boundary traps. These must be filled before a rapid increase in conductivity is experienced owing to an exponential dependence of the conductivity on the intergrain barrier potential which itself decreases linearly with increasing donor density. It will be appreciated that there is an interdependence of implant dose and gate voltage. Thus the source-drain current can be varied either by altering implanted donor concentration or by the normal transistor mechanism of altering gate to voltage to vary carrier injection.

Several modifications to the simple process and other alternative processes which rely on the same principles are also possible; some of these are described below. Using a suitable mask, ions can be implanted only at predetermined areas of the semiconductor such as the source-drain gaps of transistors. Areas of the semiconductor not required for transistors can be removed and interconnects between source, drain and gate levels may be made by conventional silicon integrated circuit processing technology. Electronic circuits may thus be fabricated from TFTs. As previously mentioned, different transistor characteristics may be obtained by varying ion dose or range.

In some cases, or with some transistor structure, a controlled thermal annealing cycle may be employed to make good electrical contact between the implanted layer and the source and drain electrodes. The device characteristics are however determined by the implanted layer, once contact with source and drain has been formed.

The conducting layer of channel within the semiconductor may also be formed by methods other than ion implantation. In another embodiment (not shown) the semiconductor layer is vacuum deposited in two or more stages and a thin doping layer for example 3–10 Å Cr is vacuum deposited between adjacent layers of the semiconductor film. Alternatively, the chromium vapour deposition is carried out at an appropriate time during the CdSe deposition to provide a chromium doped CdSe layer within the CdSe film. Again, some subsequent processing may be necessary to make contact to this channel (or channels) in the semiconductor, such as a controlled anneal or by ion implantation into the region vertically separating the channel layer from the source and drain electrodes.

A similar conducting channel may also be formed within the semiconductor film by the use of controlled thermal annealing to drive a thin, deposited, dopant layer into the film to give the desired conductivity distribution. Additional controlled thermal annealing or ion implantation steps may be performed, for example, to introduce oxygen to compensate certain regions of the semiconductor film and produce a desired conductivity profile through the semiconductor.

Figure 3A:
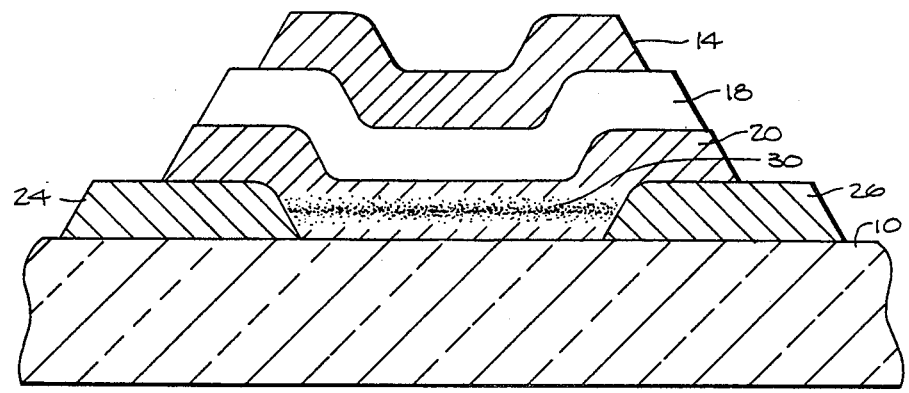
FIGS. 3A to 3D show various TFT structural configurations which embody the invention.
Figure 3B:
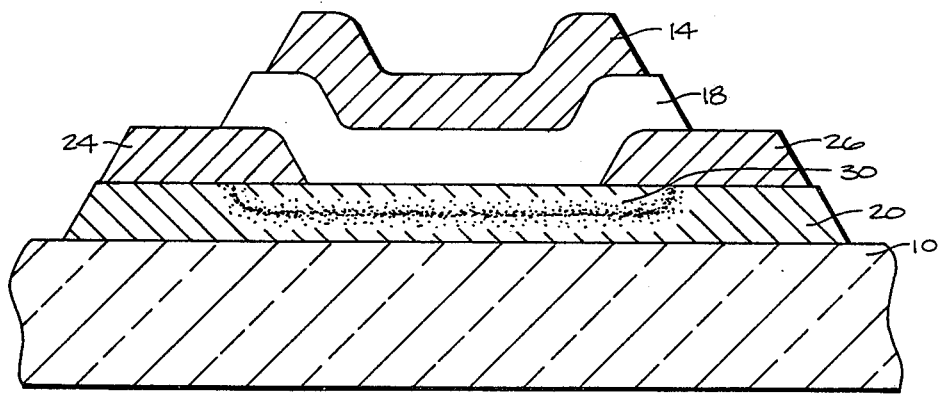
Figure 3C:
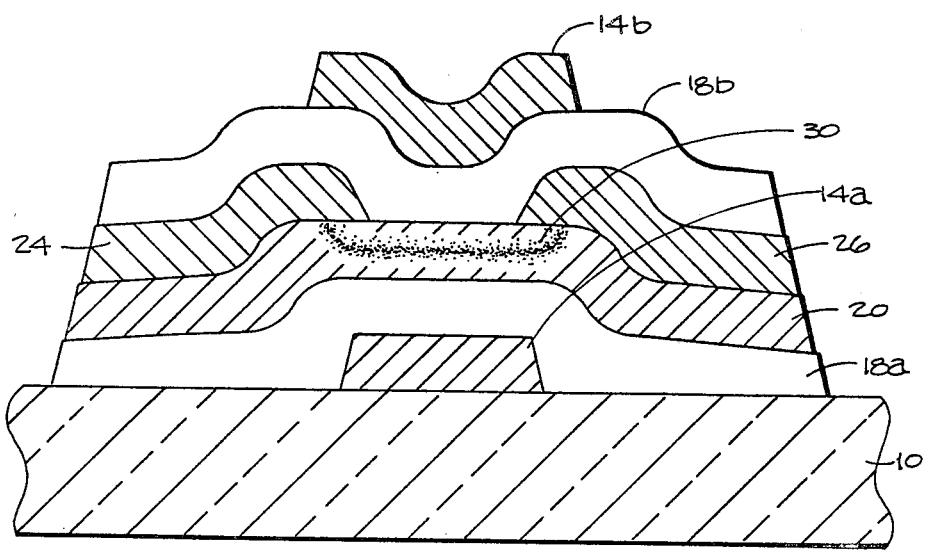
Figure 3D:
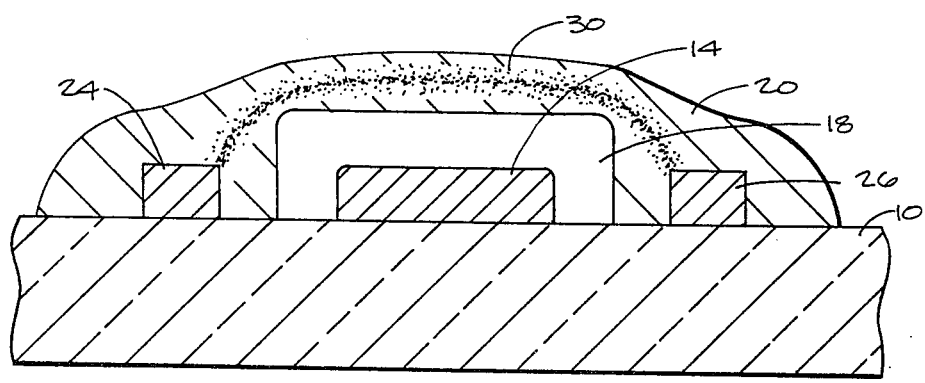

Other combinations of these processing steps are possible and other transistor structures may be used such as those illustrated in FIG. 3A (upright structure), FIG. 3B (coplanar-upright), FIG. 3C (double gated) and FIG. 3D (coplanar-linear). In these Figures, features corresponding to those of FIG. 1 are designated by like numerals. Although the relative positions of the semiconductor, the insulator, and the source, drain and gate electrodes vary, all the TFTs operate by a voltage on the gate acting through the insulator to alter the conductivity of a semiconductor channel extending between the source and drain.

Figure 2:
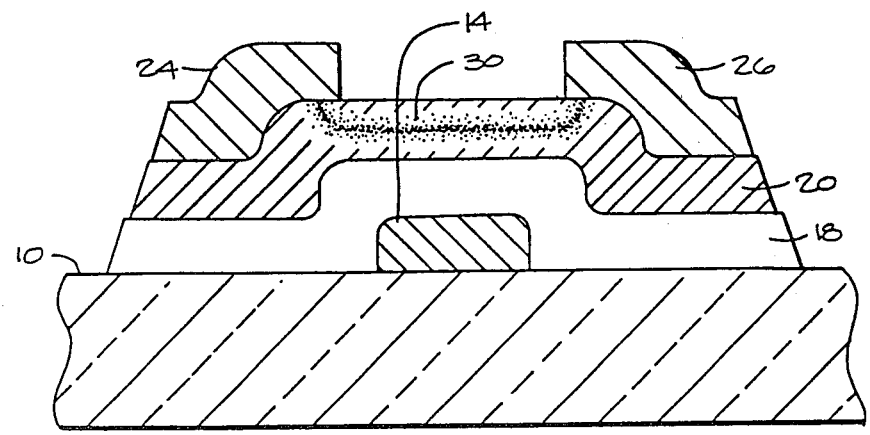
FIG. 2 shows a plan view of the TFT of FIG. 1.

While the fabrication of a TFT using particular materials has been described in FIGS. 1 and 2, it will be appreciated that any of a number of alternative semiconductors may be adopted, for example tellurium, cadmium sulphide and polysilicon. If polysilicon is used as the semiconductor layer, additional doping in the region of the source and drain contacts may be required (e.g. by ion implantation through a suitable mask) to form a good ohmic contact, as is customary in silicon integrated circuit technology. Other TFTs may also benefit from such localized doping. The dielectric may alternatively be silicon dioxide ($SiO_2$). The enhanced conductivity layer can alternatively be aluminum, boron or indium. The source, drain and gate metallization can, for example, be selected from chromium, aluminum, nickel, gold, copper, indium and molybdenum.

What is claimed is:

1. A method of fabricating a thin film transistor comprising:
   depositing upon a substrate:
   (i) a semiconductor layer having a zone of enhanced conductivity spaced from respective boundaries of the layer;
   (ii) a dielectric layer having surface contact with a first surface of the semiconductor layer;
   (iii) first and second conducting regions contacting said semiconductor layer at spaced locations; and
   (iv) a third conducting region at one side of the dielectric layer remote from the semiconductor layer coextensive with a part at least of the space between said first and second conducting regions.

2. A method as claimed in claim 1, wherein the enhanced conductivity zone is produced by ion implantation.

3. A method as claimed in claim 2, further comprising directing the implantation ions through a mask thereby limiting ion impingement to exposed semiconductor extending between the first and second conducting regions.

4. A method as claimed in claim 2, further comprising thermally annealing to promote diffusion of dopant from the first conducting region into a region intermediate said first conducting region and the enhanced conductivity zone and to promote diffusion of dopant from the second conducting region into a region intermediate the second conducting region and the enhanced conductivity zone.

5. A method as claimed in claim 1, in which the enhanced conductivity zone is produced by depositing a conducting film over the semiconductor and heating to promote diffusion of the conducting film into the semiconductor.

6. A method as claimed in claim 1, in which the semiconductor layer is produced in a multi-stage deposition process, one such stage comprising deposition of said enhanced conductivity zone.

7. A method as claimed in claim 1, in which the enhanced conductivity zone is produced by a first step of enhancing the conductivity of the semiconductor layer from one boundary to a first depth, and a second step of restoring the resistivity of the semiconductor from said one boundary to a second, reduced, depth to isolate said enhanced conductivity zone between the boundaries.

8. A method as claimed in claim 1, in which the order of the enumerated deposition steps is as follows to produce a TFT of inverted structure:
   iv; ii; i; iii.

9. A method as claimed in claim 8 further comprising depositing a second dielectric layer over said first and second conducting regions and an exposed part of the semiconductor layer and then depositing a fourth conducting region over the second insulation layer to be coextensive with a part at least of the space between said first and second conducting regions, whereby to produce a TFT of double gated structure.

10. A method as claimed in claim 1, in which the order of the enumerated deposition steps is as follows to produce a TFT of upright structure:
    iii; i; ii; iv.

11. A method as claimed in claim 1, in which the order of the enumerated deposition steps is as follows to produce a TFT of coplanar-upright structure:
    i; iii; ii; iv.

12. A method as claimed in claim 1, in which the order of the enumerated deposition steps is as follows to produce a TFT of coplanar-linear-structure:
    iii and iv simultaneously; ii; i.

* * * * *